United States Patent
Chen

(10) Patent No.: US 7,733,662 B2
(45) Date of Patent: Jun. 8, 2010

(54) CIRCUIT BOARD WITH EMBEDDED PASSIVE COMPONENT AND FABRICATING PROCESS THEREOF

(75) Inventor: Tsung-Yuan Chen, Taoyuan County (TW)

(73) Assignee: Unimicron Technology Corp., Taoyuan (TW)

(*) Notice: Subject to any disclaimer, the term of this patent is extended or adjusted under 35 U.S.C. 154(b) by 552 days.

(21) Appl. No.: 11/626,379

(22) Filed: Jan. 24, 2007

(65) Prior Publication Data
US 2007/0171621 A1    Jul. 26, 2007

(30) Foreign Application Priority Data
Jan. 25, 2006 (TW) .............................. 95102753 A

(51) Int. Cl.
*H05K 1/18* (2006.01)
(52) U.S. Cl. ................ 361/761; 361/760; 361/763; 361/766; 361/298.2; 361/298.4; 174/255
(58) Field of Classification Search ............. 361/299.1, 361/299.2, 299.5, 303, 298.2, 298.3, 298.4, 361/307, 308.1, 728, 734, 738, 760, 761, 361/763, 766, 777, 782, 821, 328, 271, 331, 361/522, 541, 306.1, 538, 306.2, 306.3, 321.2, 361/310; 174/260–266
See application file for complete search history.

(56) References Cited

U.S. PATENT DOCUMENTS

| | | | | |
|---|---|---|---|---|
| 6,228,196 | B1* | 5/2001 | Sakamoto et al. | 156/89.17 |
| 6,445,565 | B1* | 9/2002 | Toyoda et al. | 361/303 |
| 6,706,975 | B2* | 3/2004 | Sumi et al. | 174/264 |
| 6,884,313 | B2* | 4/2005 | Liu et al. | 156/292 |
| 2002/0185303 | A1* | 12/2002 | Takeuchi et al. | 174/256 |
| 2002/0195270 | A1* | 12/2002 | Okubora et al. | 174/260 |
| 2004/0118600 | A1* | 6/2004 | Lee et al. | 174/260 |
| 2005/0013087 | A1* | 1/2005 | Wu et al. | 361/303 |

* cited by examiner

*Primary Examiner*—Dameon E Levi
*Assistant Examiner*—Hoa C Nguyen
(74) *Attorney, Agent, or Firm*—Jianq Chyun IP Office

(57) ABSTRACT

A process for fabricating a circuit board with an embedded passive component is provided. First, an electrode-patterned layer having electrodes is formed on a surface of a conductive layer. Then, a passive component material is filled in the intervals between the electrodes. Then, the conductive layer and the electrode-patterned layer are laminated to a dielectric layer, wherein the electrode-patterned layer is embedded in the dielectric layer. Next, the conductive layer is patterned to form a circuit layer.

9 Claims, 7 Drawing Sheets

CIRCUIT BOARD WITH EMBEDDED PASSIVE COMPONENT AND FABRICATING PROCESS THEREOF

CROSS-REFERENCE TO RELATED APPLICATION

This application claims the priority benefit of Taiwan application serial no. 95102753, filed Jan. 25, 2006. All disclosure of the Taiwan application is incorporated herein by reference.

BACKGROUND OF THE INVENTION

1. Field of Invention

The present invention relates to a circuit board and a fabricating process thereof. More particularly, the present invention relates to a circuit board with an embedded passive component and a fabricating process thereof.

2. Description of Related Art

Due to the increasingly greater degree of integration of electronic products, circuit layers of circuit boards applied in highly integrated electronic products have changed from single or double layers to six layers, eight layers, or even more than ten layers, so that electronic devices can be mounted more densely on circuit boards. However, with the increase of layer counts of circuit boards and the density of the lines, influences to electrical signals transmitted in circuit boards caused by resistance-capacitance delay (RC delay) or cross-talk become more and more obvious. Therefore, additional passive components must be disposed in limited areas of circuit boards to improve the electrical properties thereof.

As described above, besides passive components, various electronic devices are further arranged in limited layout areas of circuit boards. However, the specified passive components with particular electrical values may not completely meet a particular given circuit design. Therefore, it is practical to fabricate passive components directly in circuit boards. Moreover, passive components in circuit boards can also adjust the electrical values thereof depending on layout design, circuit board material selection, and the like.

FIGS. 1A-1E show schematic sectional views of a conventional process for fabricating a circuit board with an embedded passive component. First, referring to FIG. 1A, a first copper foil layer 110 is provided, and a capacitive material is coated on the overall first copper foil layer 110, so as to form a capacitive material layer 120. Next, referring to FIG. 1B, a second copper foil layer 130 is formed on the capacitive material layer 120 in a lamination manner. Then, referring to FIG. 1C, the second copper foil layer 130 in FIG. 1B undergoes a lithographic process and an etching process to form a second circuit layer 130'. Then, referring to FIG. 1D, the capacitive material layer 120 in FIG. 1C undergoes a patterning process, for example, including a lithographic process and an etching process, to form a patterned capacitive material layer 120'. Next, a multilayer circuit board L and a dielectric layer 140 are provided, and the structure formed by the above processes, the multilayer circuit board L, and the dielectric layer 140 are laminated, wherein the patterned capacitive material layer 120' and the second circuit layer 130' are embedded in the dielectric layer 140. Further, referring to FIG. 1E, the first copper foil layer 110 undergoes the patterning process, for example, including a lithographic process and an etching process, to form a first circuit layer 110'. Thereafter, a plurality of conductive vias (not shown) is formed in the structure formed by the above processes to electrically connect the multilayer circuit board L and the first circuit layer 110'.

However, only single layer capacitance devices can be fabricated through conventional circuit board processes, and just one kind of passive component (referred to as a capacitance device herein) can be embedded in the single layer. Moreover, each capacitance device occupies a large area, such that the area for accommodating other integrated circuit devices is relatively reduced.

SUMMARY OF THE INVENTION

In view of the above, an object of the present invention is to provide a process for fabricating a circuit board with an embedded passive component for reducing the area occupied by the passive components.

Moreover, another object of the present invention is to provide a circuit board with an embedded passive component that occupies a small space.

Based on the above and other objects, the present invention provides a process for fabricating a circuit board with an embedded passive component, which comprises the following steps. First, an electrode-patterned layer is formed on a first surface of a conductive layer, wherein the electrode-patterned layer has a plurality of electrodes. Next, a passive component material is filled in the intervals between the electrodes. Then, the conductive layer and the electrode-patterned layer are laminated to a dielectric layer, wherein the electrode-patterned layer is embedded in the dielectric layer. Next, the conductive layer is patterned to form a first circuit layer.

According to an embodiment of the present invention, the step of forming the electrode-patterned layer comprises forming a patterned photoresist layer on the first surface of the conductive layer; then performing an electroplating process to form the electrode-patterned layer; and then removing the patterned photoresist layer.

According to an embodiment of the present invention, the step of forming the first circuit layer comprises forming a patterned photoresist layer on a second surface of the conductive layer; next performing an electroplating process to form the first circuit layer; then removing the patterned photoresist layer; and then removing a part of the conductive layer, such that the electrodes are electrically insulated.

According to an embodiment of the present invention, after forming the first circuit layer, it further comprises forming a patterned dielectric layer on the first circuit layer, wherein the patterned dielectric layer exposes a part of the first circuit layer, and then, forming a second circuit layer on the patterned dielectric layer, wherein the second circuit layer is electrically connected to the first circuit layer.

Based on the above and other objects, the present invention provides a circuit board with an embedded passive component, which comprises a dielectric layer, an electrode-patterned layer, a passive component material, and a first circuit layer, wherein the electrode-patterned layer is embedded in the dielectric layer, and the electrode-patterned layer has a plurality of electrodes. Moreover, a passive component material is filled in the intervals between the electrodes. Furthermore, the first circuit layer is disposed on the dielectric layer and the electrode-patterned layer, and the first circuit layer is electrically connected to the electrode-patterned layer.

According to an embodiment of the present invention, the thickness of the electrode-patterned layer falls in the range of, for example, 10 μm to 100 μm.

According to an embodiment of the present invention, the electrodes are, for example, plate-shaped, and the electrodes are approximately perpendicularly embedded in the dielectric layer.

According to an embodiment of the present invention, the thickness of the passive component material is, for example, smaller than or equal to that of the electrode-patterned layer.

According to an embodiment of the present invention, the circuit board with an embedded passive component further comprises, for example, a second circuit layer and a patterned dielectric layer disposed between the first circuit layer and the second circuit layer, wherein the first circuit layer is electrically connected to the second circuit layer.

According to an embodiment of the present invention, the dielectric layer is, for example, a prepreg or core layer.

According to an embodiment of the present invention, the passive component material is, for example, resistive or inductive material.

Based on the above, in the present invention, a passive component is embedded in a dielectric layer (e.g. prepreg or core layer), and the electrodes of the passive component are substantially perpendicular to the dielectric layer, thus the space occupied by the passive component is significantly reduced. Moreover, circuit boards fabricated with the circuit board fabricating process of the present invention have high reliability and low variance.

In order to make aforementioned and other objects, features, and advantages of the present invention comprehensible, preferred embodiments accompanied with figures are described in detail below.

It is to be understood that both the foregoing general description and the following detailed description are exemplary, and are intended to provide further explanation of the invention as claimed.

DESCRIPTION OF EMBODIMENTS

First Embodiment

Figure 1A:
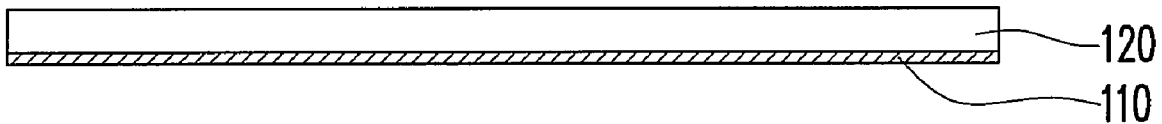
FIGS. 1A-1E show schematic sectional views of a conventional process for fabricating a circuit board with an embedded passive component.
Figure 1B:
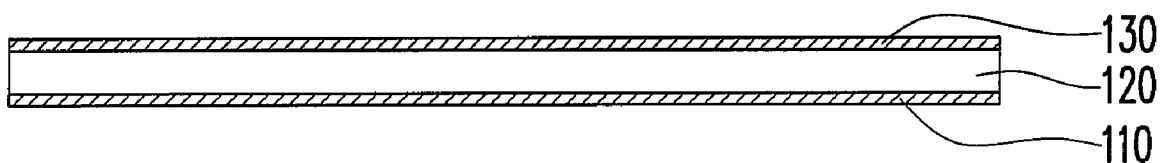
Figure 1C:
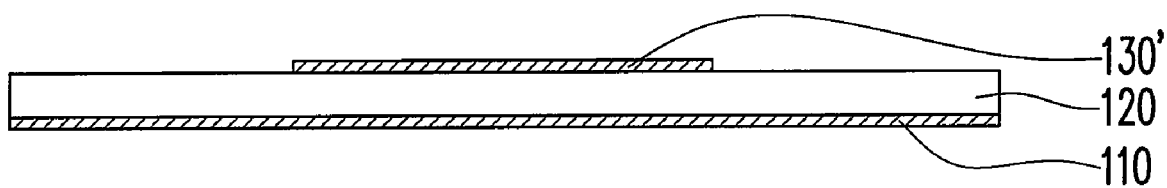
Figure 1D:
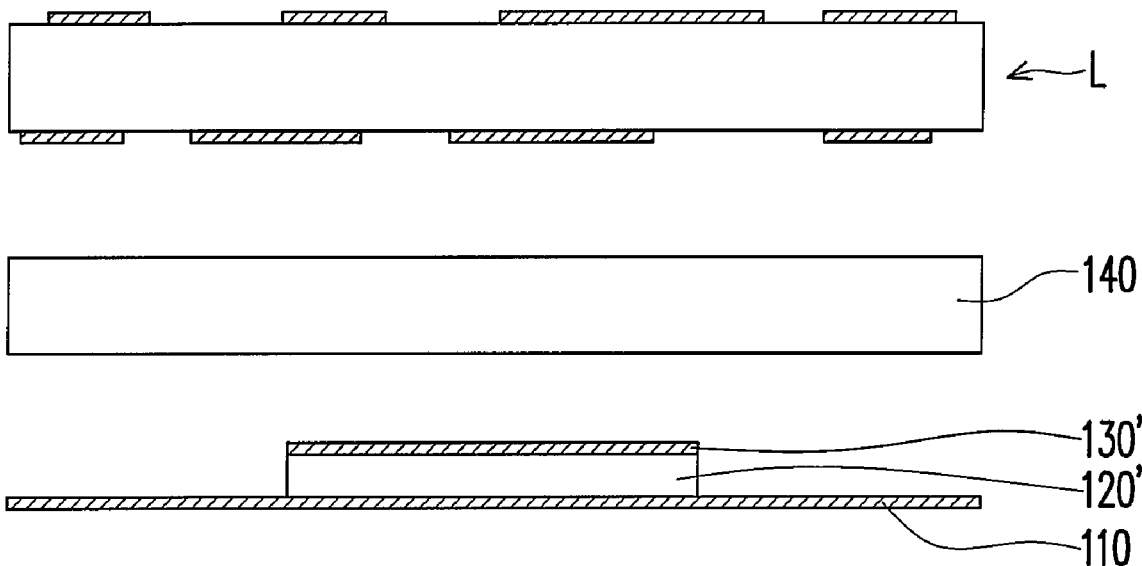
Figure 1E:
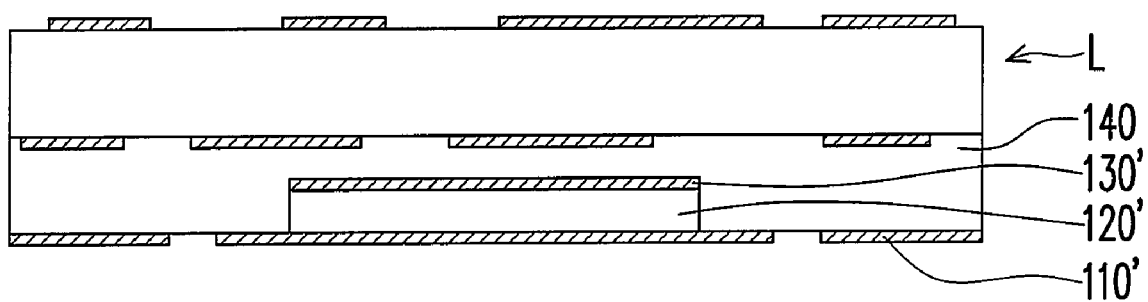
Figure 2A:
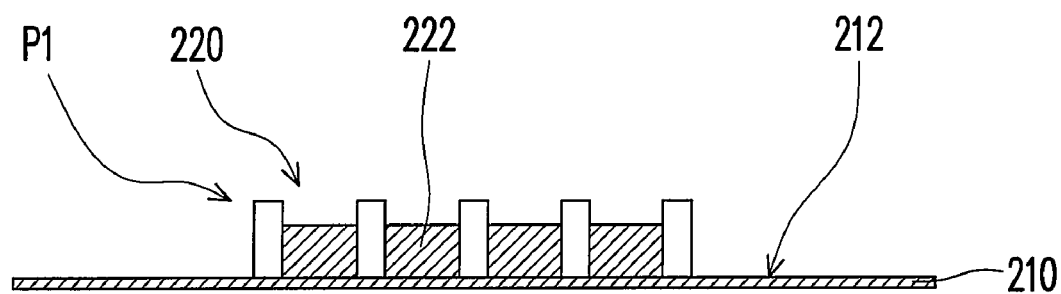
FIGS. 2A-2I show schematic sectional views of a process for fabricating a circuit board with an embedded passive component according to the first embodiment of the present invention.
Figure 2B:
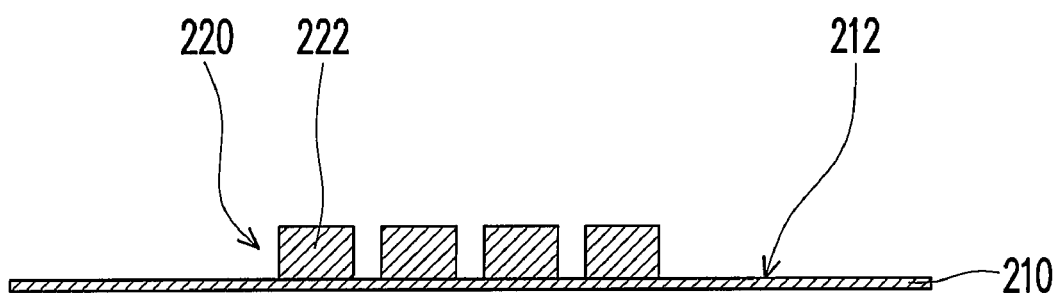

FIGS. 2A-2I show schematic sectional views of a process for fabricating a circuit board with an embedded passive component according to the first embodiment of the present invention. The fabricating process for the circuit board of the present invention comprises the following steps. Referring to FIG. 2A and FIG. 2B, first, a conductive layer 210 is provided, and the conductive layer 210 is a copper foil or another kind of metal film. Then, a patterned photoresist layer P1 is formed on a first surface 212 of the conductive layer 210, wherein the step of forming the patterned photoresist layer P1 comprises forming a photoresist material layer (not shown) on the conductive layer 210 by adhering a photoresist dry film or coating a liquid photoresist. And then, the photoresist material layer is patterned to form a patterned photoresist layer P1, wherein the patterning process comprises an exposing process and a developing processes.

Then, an electroplating process is performed to form an electrode-patterned layer 220 on the area without being covered by the patterned photoresist layer P1, wherein the electrode-patterned layer 220 has a plurality of electrodes 222, and the electrodes 222 are substantially perpendicular to the conductive layer 210. Next, the patterned photoresist layer P1 is removed, wherein the patterned photoresist layer P1 is removed by, for example, cleaning with an organic solution or an inorganic solution.

However, the method of forming the electrode-patterned layer 220 on the conductive layer 210 is not limited to the above process. For example, a thick conductive layer (not shown) can be first provided, and then a part of the thick conductive layer is removed to form the electrode-patterned layer 220.

Figure 2C:
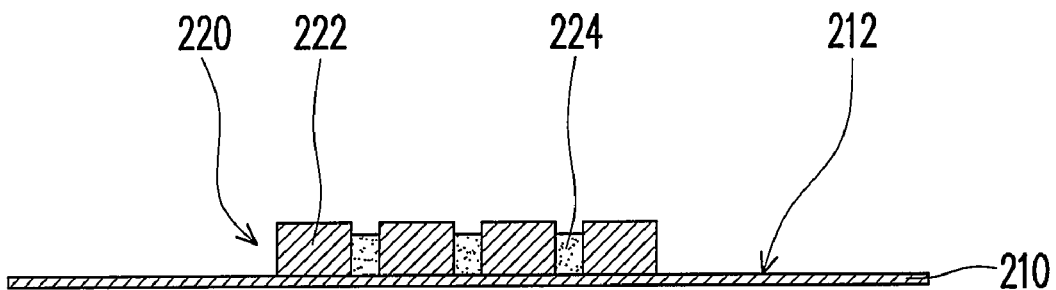

Referring to FIG. 2C, a passive component material 224 is filled in the intervals between the electrodes 222, wherein the method for filling the passive component material 224 may be screen printing. Moreover, the filled passive component material 224 can be a resistive material, a capacitive material, or an inductive material.

Figure 2D:
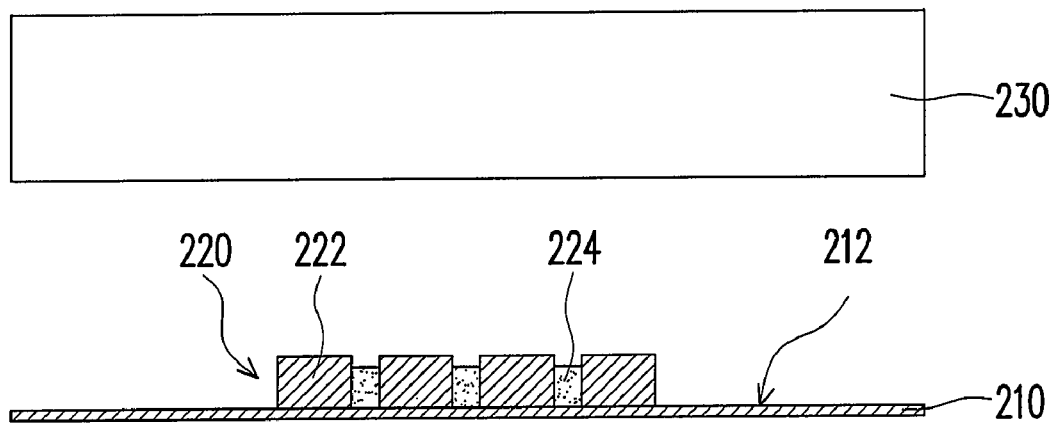
Figure 2E:
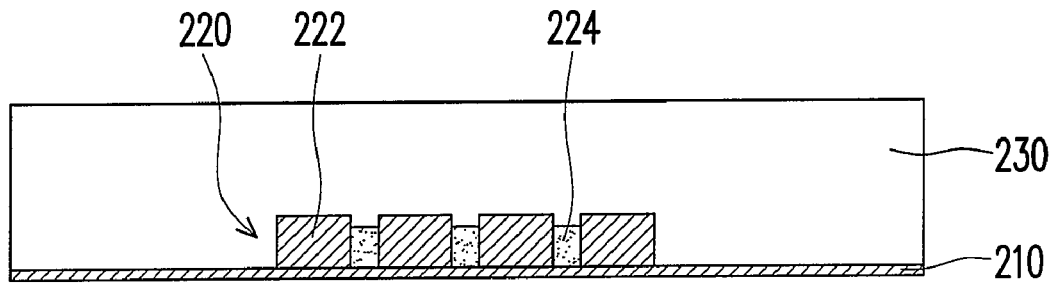

Referring to FIGS. 2D-2E, a dielectric layer 230 is provided, wherein the dielectric layer 230 is, for example, a core layer or a prepreg, and in the present embodiment, the dielectric layer 230 is a core layer. Then, the conductive layer 210 and the electrode-patterned layer 220 are laminated to the dielectric layer 230, wherein the electrode-patterned layer 220 is embedded in the dielectric layer 230.

Figure 2F:
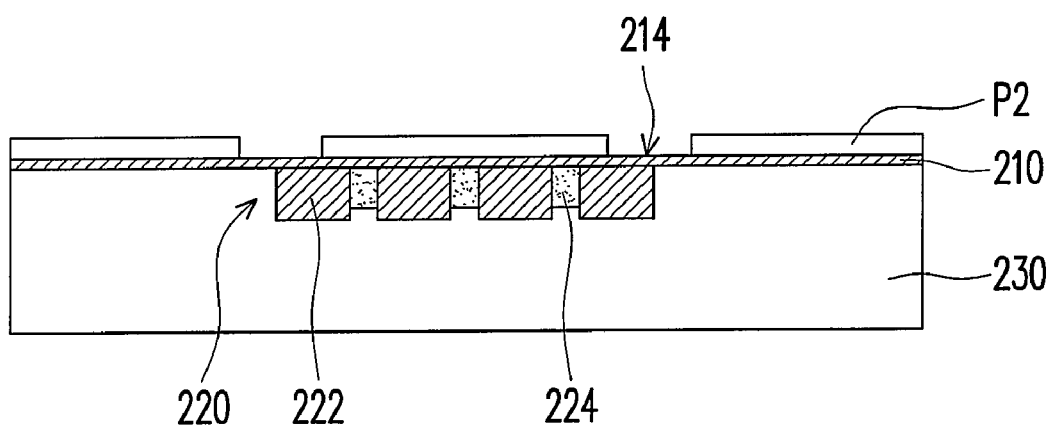
Figure 2G:
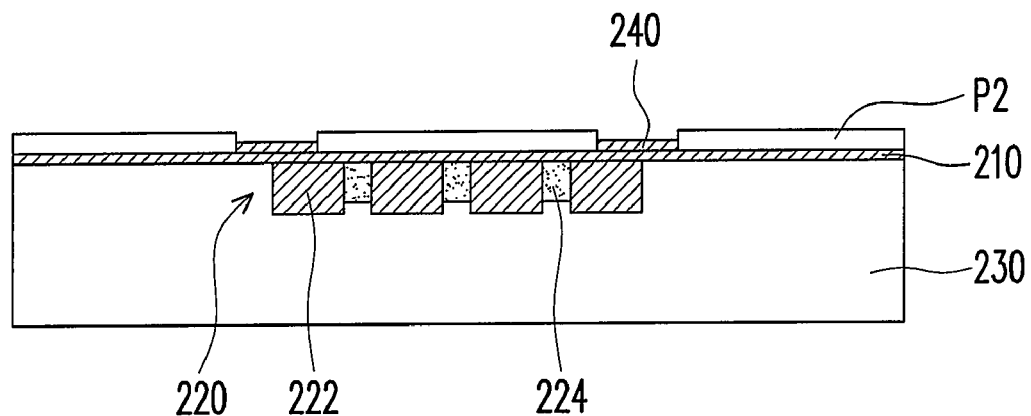
Figure 2H:
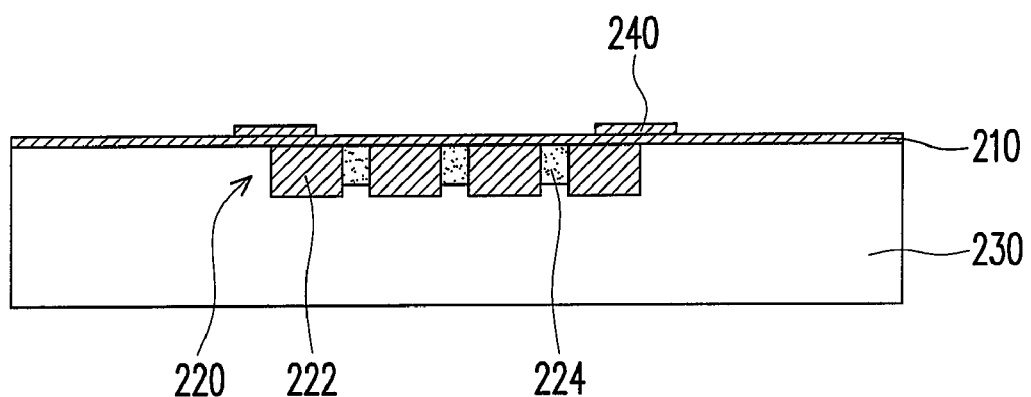
Figure 2I:
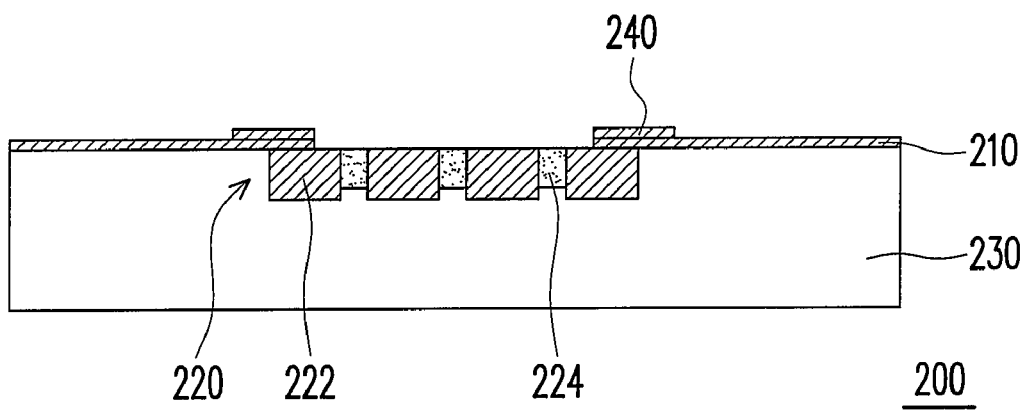

Referring to FIG. 2F, a patterned photoresist layer P2 is formed on a second surface 214 of the conductive layer 210, wherein the method of forming the patterned photoresist layer P2 is similar to that of forming the patterned photoresist layer P1 on the first surface 212. Referring to FIG. 2G, an electroplating process is performed to form a first circuit layer 240 on the area without being covered by the patterned photoresist layer P2. Referring to FIG. 2H, the patterned photoresist layer P2 is removed, wherein the method of removing the patterned photoresist layer P2 is similar to that of removing the patterned photoresist layer P1. Referring to FIG. 2I, a part of the conductive layer 210 is removed such that the electrodes 222 are electrically insulated, wherein the method of removing a part of the conductive layer 210 is, for example, performing an etching process for the conductive layer 210. Thus, the process of fabricating the circuit board 200 is substantially completed.

However, after FIG. 2E, a part of the conductive layer 210 can be directly removed to form the first circuit layer 240 and make the electrodes 222 electrically insulated from one another. Moreover, when the dielectric layer 230 is a core layer, after forming the first circuit layer 240, other circuits can be formed by a build-up or lamination method. The build-up method is illustrated as an example herein below.

Figure 2J:
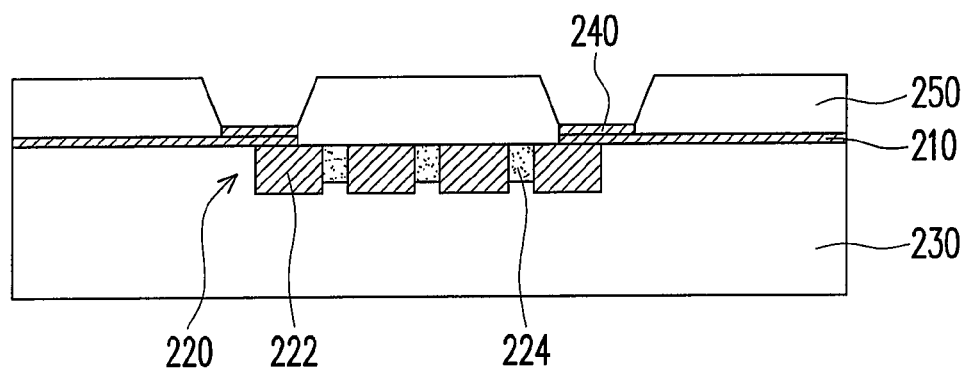
FIGS. 2J-2K show schematic sectional views of a process for fabricating a second circuit layer according to the first embodiment of the present invention.
Figure 2K:
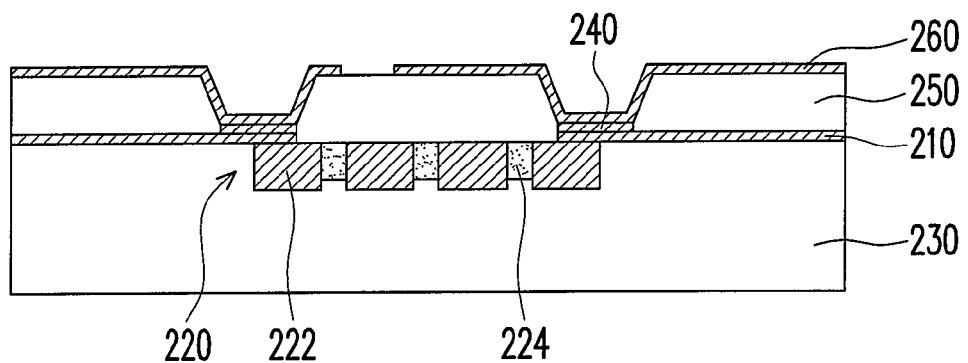

Referring to FIGS. 2J-2K, the schematic sectional views of a process for fabricating a second circuit layer according to the first embodiment of the present invention are shown. After forming the first circuit layer 240, other circuits are formed with the build-up method. Referring to FIG. 2J, more particularly, a patterned dielectric layer 250 is formed on the first circuit layer 240, wherein the patterned dielectric layer 250 exposes a part of the first circuit layer 240. Moreover, the method of forming the patterned dielectric layer 250 includes, for example, forming a dielectric material layer (not shown) on the first circuit layer 240 by spin coating, and then performing a patterning process (e.g. including a lithographic and etching process) to form the patterned dielectric layer 250.

Referring to FIG. 2K, a conductive material layer (not shown) is formed on the patterned dielectric layer 250, wherein the conductive material layer can be formed by sputtering or other metal deposition process. Then, a patterning process (e.g. including a lithographic process and an etching process) is performed on the conductive material layer to form a second circuit layer 260, wherein the second circuit layer 260 is electrically connected to the first circuit layer 240.

It shall be noted that the above second circuit layer 260 is formed by a build-up method; however, a lamination method or other methods can be used. Moreover, other circuit layers can be sequentially formed on the second circuit layer 260 in accordance with the requirements of design, and the forming method of the circuit layers is described above. The structure of the circuit board with an embedded passive component will be described in detail below.

Figure 3:
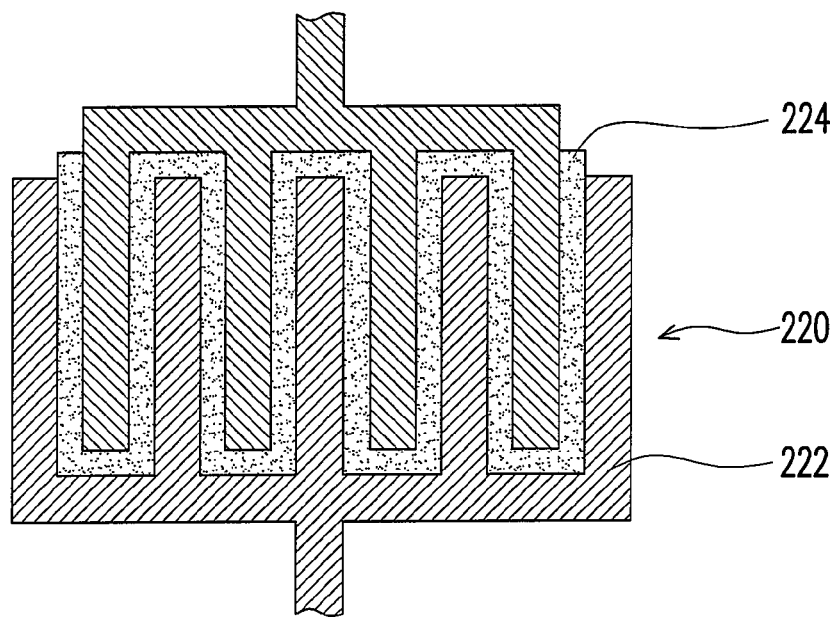
FIG. 3 shows a schematic top view of a part of means of the circuit board with an embedded passive component according to the first embodiment of the present invention.

FIG. 3 shows a schematic top view of a part of means of the circuit board with an embedded passive component according to the first embodiment of the present invention. Referring to FIG. 2I and FIG. 3, the circuit board with an embedded passive component 200 comprises a dielectric layer 230, an electrode-patterned layer 220, a passive component material 224, and a first circuit layer 240. The electrode-patterned layer 220 is embedded in the dielectric layer 230, and the electrode-patterned layer 220 has a plurality of electrodes 222. It can be seen from FIG. 3 that the electrodes 222 of the present invention take the electrode pattern of a capacitance device. However, the electrodes 222 can also be the electrode pattern of an inductance device or a resistance device. Moreover, the thickness of the electrode-patterned layer 220 falls in the range of, for example, 10 µm to 100 µm, and the thickness of the electrode-patterned layer 220 is, for example, larger than the thickness of the first circuit layer 240.

The passive component material 224 is disposed in the intervals between the electrodes 222, and the thickness of the passive component material 224 is, for example, smaller than or equal to the thickness of the electrode-patterned layer 220. Moreover, the first circuit layer 240 is disposed on the dielectric layer 230 and the electrode-patterned layer 220, and the first circuit layer 240 is electrically connected to the electrode-patterned layer 220. When the dielectric layer 230 is a prepreg, the structure as shown in FIG. 2I is regarded as a single layer circuit board.

Further, when the dielectric layer 230 is a core layer, the circuit board with an embedded passive component of the present invention further comprises, for example, a second circuit layer 260 and a patterned dielectric layer 250 disposed between the first circuit layer 240 and the second circuit layer 260, and the first circuit layer 240 is electrically connected to the second circuit layer 260.

Since the electrode-patterned layer 220 is embedded in the dielectric layer 230, i.e. in the core layer or prepreg, and the electrode 222 is substantially perpendicular to the dielectric layer 230; compared with the conventional technology, the area occupied by the passive component of the present invention can be reduced. Moreover, since the passive component occupies a smaller area, the circuit board of the present invention can be integrated with other electronic devices or passive components. Further, compared with the conventional technology, the circuit board of the present invention has high reliability and low variance.

Second Embodiment

Figure 4A:
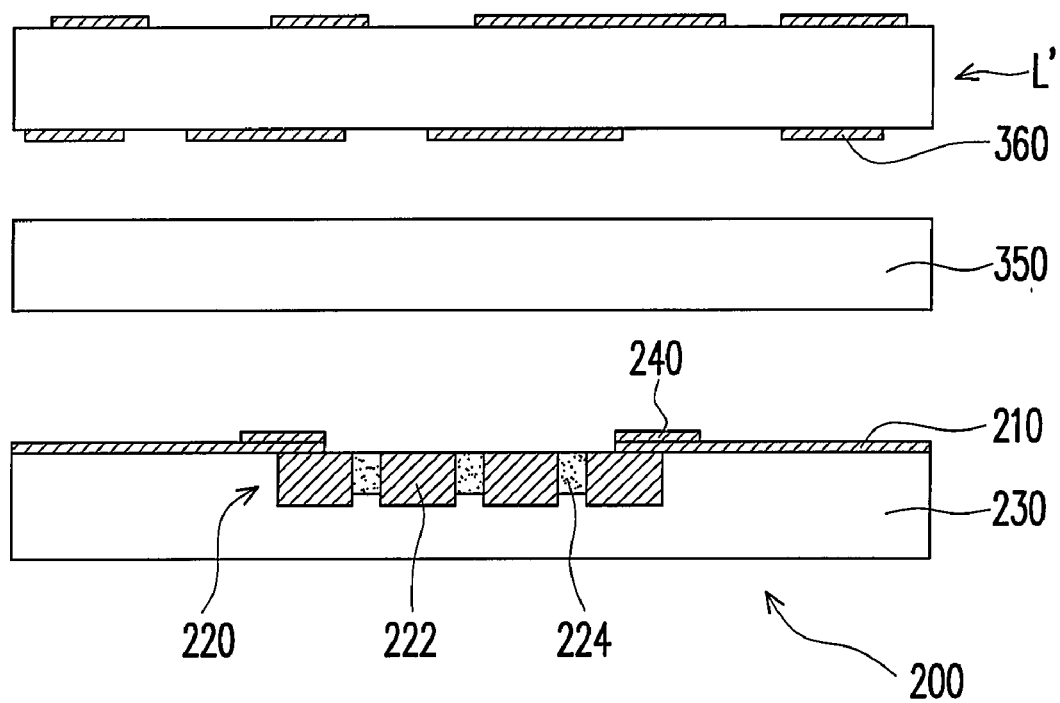
FIGS. 4A-4B show schematic sectional views of a process for fabricating a circuit board with an embedded passive component according to the second embodiment of the present invention.
Figure 4B:
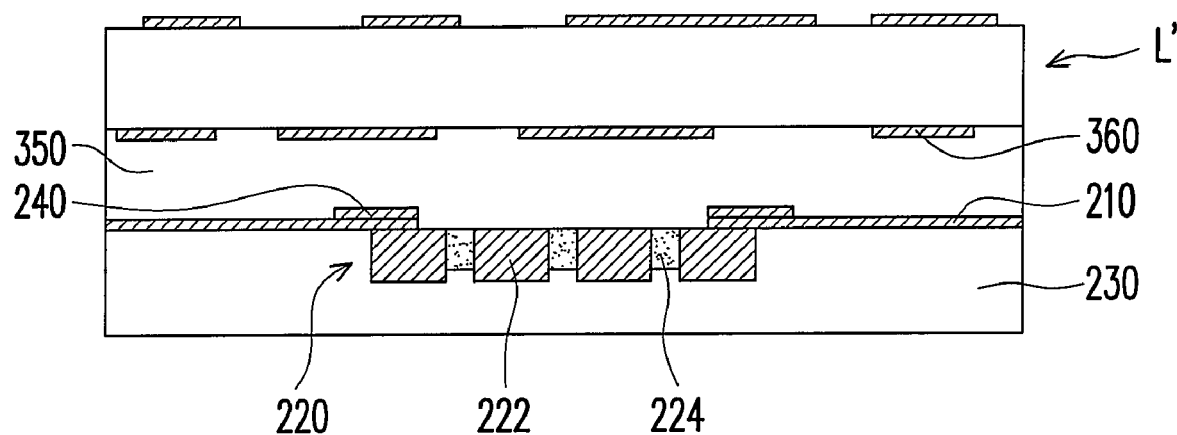

FIGS. 4A-4B show the schematic sectional views of a process for fabricating a circuit board with an embedded passive component according to a second embodiment of the present invention. Referring to FIG. 4A, when the dielectric layer 230 is a prepreg, a circuit board 200 is regarded as a single layer circuit board. Therefore, the circuit board 200 is laminated with other circuit boards. Then, a circuit unit L' and a dielectric layer 350 are provided, wherein the circuit unit L' is a dual-layer circuit board or a multilayer circuit board, and the circuit unit L' has a circuit layer 360 disposed on the two opposite surfaces thereof respectively.

Referring to FIG. 4B, the circuit board 200 and the circuit unit L' are laminated, and the dielectric layer 350 is disposed between the circuit board 200 and the circuit unit L'. Then, the first circuit layer 240 is electrically connected to the circuit layer 360 of the circuit unit L'. For example, a plurality of conductive vias (not shown) is formed in the structure after lamination to electrically connect the first circuit layer 240 and the circuit layer 360 of the circuit unit L'.

To sum up, the circuit board with an embedded passive component of the present invention at least has the following advantages.

1. In the present invention, the electrodes of the passive component are embedded in the dielectric layer, i.e. in the core layer or prepreg, and the electrodes of the passive components are substantially perpendicular to the dielectric layer. Therefore, compared with the conventional technology, the space occupied by the passive component of the present invention is significantly reduced.

2. The circuit board fabricated by the circuit board fabricating process of the present invention has high reliability and low variance, thus the manufacturing cost can be reduced.

3. Various passive components (e.g. resistors, capacitors, or inductors) can be formed in a single layer of the circuit board of the present invention in accordance with the requirements of the design, which is more flexible in design compared with the conventional technology.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board with an embedded passive component, comprising:

a dielectric layer;

an electrode-patterned layer, embedded in the dielectric layer and located at a surface of the dielectric layer, wherein the electrode-patterned layer has a plurality of electrodes, each of the electrodes has a top surface adjacent to and substantially parallel to the surface of the dielectric layer, a bottom surface opposite the top surface and connecting with the dielectric layer, and a side surface connecting the top surface and the bottom surface, and the side surface is substantially perpendicular to the surface of the dielectric layer;

a passive component material, disposed in the intervals between the electrodes, wherein the passive component material connects the side surfaces of the electrodes, and wherein neither the top surface nor the bottom surface is at least partially covered by the passive component material; and a first circuit layer disposed on the dielectric layer and the electrode-patterned layer, and the first circuit layer is electrically connected to the electrode-patterned layer.

2. The circuit board with an embedded passive component as claimed in claim 1, wherein the thickness of the electrode-patterned layer falls in the range of 10 μm to 100 μm.

3. The circuit board with an embedded passive component as claimed in claim 1, wherein the electrodes are plate-shaped, and the electrodes are perpendicularly embedded in the dielectric layer.

4. The circuit board with an embedded passive component as claimed in claim 1, wherein the thickness of the passive component material is smaller than or equal to the thickness of the electrode-patterned layer.

5. The circuit board with an embedded passive component as claimed in claim 1, further comprising a second circuit layer and a patterned dielectric layer disposed between the first circuit layer and the second circuit layer, wherein the first circuit layer is electrically connected to the second circuit layer.

6. The circuit board with an embedded passive component as claimed in claim 1, wherein the dielectric layer is a prepreg.

7. The circuit board with an embedded passive component as claimed in claim 1, wherein the passive component material is resistive or inductive material.

8. The circuit board with an embedded passive component as claimed in claim 1, wherein the dielectric layer is a core layer.

9. The circuit board with an embedded passive component as claimed in claim 1, wherein each of the electrodes has a plurality of branches, the branches of one of the electrodes and the branches of another of the electrodes are alternately disposed, and the passive component material is zigzag-shaped.

* * * * *